(12) United States Patent
Wicks

(10) Patent No.: US 8,274,096 B2
(45) Date of Patent: Sep. 25, 2012

(54) SEMICONDUCTOR DEVICE AND METHOD

(75) Inventor: Gary W. Wicks, Fairport, NY (US)

(73) Assignee: University of Rochester, Rochester, NY (US)

( * ) Notice: Subject to any disclaimer, the term of this patent is extended or adjusted under 35 U.S.C. 154(b) by 342 days.

(21) Appl. No.: 12/706,016

(22) Filed: Feb. 16, 2010

(65) Prior Publication Data

US 2010/0230720 A1  Sep. 16, 2010

Related U.S. Application Data

(60) Provisional application No. 61/152,289, filed on Feb. 13, 2009.

(51) Int. Cl.
*H01L 31/102* (2006.01)

(52) U.S. Cl. .............. 257/188; 257/30; 257/37; 257/59; 257/103; 257/E21.002; 438/47; 438/57; 438/72

(58) Field of Classification Search .................. None
See application file for complete search history.

(56) References Cited

U.S. PATENT DOCUMENTS 6,507,043 B1 * 1/2003 Chow et al. ..................... 257/46

FOREIGN PATENT DOCUMENTS

WO         01/67570 A3   9/2001

* cited by examiner

*Primary Examiner* — Kyoung Lee
(74) *Attorney, Agent, or Firm* — William Greener; Bond, Schoeneck & King, PLLC

(57) ABSTRACT

The present invention is directed to a semiconductor device that includes at least one p-n junction including a p-type material, an n-type material, and a depletion region. The at least one p-n junction is configured to generate bulk photocurrent in response to incident light. The at least one p-n junction is characterized by a conduction band energy level, a valence band energy level and a surface Fermi energy level. The surface Fermi energy level is pinned either near or above the conduction band energy level or near or below the valence band energy level. A unipolar barrier structure is disposed in a predetermined region within the at least one p-n junction. The unipolar barrier is configured to raise the conduction band energy level if the surface Fermi energy level is pinned near or above the conduction band energy level or lower the valence band energy level if the surface Fermi energy level is pinned near or below the valence band energy level such that the unipolar barrier is configured to propagate the bulk photocurrent and substantially block surface leakage current. The at least one p-n junction and the unipolar barrier are integrally formed.

32 Claims, 8 Drawing Sheets

SEMICONDUCTOR DEVICE AND METHOD

CROSS-REFERENCE TO RELATED APPLICATIONS

This application claims the benefit of priority under 35 U.S.C. §119(e) to U.S. Provisional Patent Application Ser. No. 61/152,289 filed on Feb. 13, 2009, the content of which is relied upon and incorporated herein by reference in its entirety.

FEDERALLY SPONSORED RESEARCH

This invention was made with government support under Award number FA9550-08-1-0109 sponsored by the Air Force Office of Sponsored Research. The government has certain rights in the invention.

BACKGROUND OF THE INVENTION

1. Field of the Invention

The present invention relates generally to the field of electronic devices, and particularly to semiconductor devices.

2. Technical Background

The following descriptions and examples are not admitted to be prior art by virtue of their inclusion within this section.

A photodiode is a type of diode that is configured to convert light of a particular wavelength into either current or voltage, depending on its mode of operation. The semiconductor materials employed in fabricating a given p-n junction determine the operating wavelength (i.e., color) of light that the diode will convert into current or voltage. In the infrared portion of the spectrum, the wavelength (λ) ranges from approximately 1 to 100 μm. By way of example, a photodiode fabricated using InGaAs would operate at about 1.3 μm, which is in the infrared portion of the spectrum. A photodiode fabricated from AlGaAs would operate in the visible spectrum at about 0.7 μm (red). A photodiode operating at a wavelength of about 0.35 μm (ultraviolet-UV) might be constructed using AlGaN materials. The teachings of the present invention are, therefore, applicable to semiconductor devices operating from the infrared portion of the spectrum to the ultraviolet portion of the spectrum. The present invention should not be necessarily construed as being limited to the material examples provided herein.

The p-n junction is the basic building block employed in many semiconductor devices. Most diodes, including photodiodes and LEDs are p-n junction devices. Certain transistors (e.g., bipolar junction transistors) consist of two back-to-back p-n junctions. Thus, p-n junctions are the basis of semiconductor technologies such as diodes, transistors, integrated circuits and photovoltaic devices. The "p" in the term p-n junction refers to a semiconductor material that has positively charged current carriers (i.e., p-type) and the "n" in the term p-n junction refers to a semiconductor material that has negatively charged current carriers (i.e., n-type). When the two materials are brought together, the p-n junction is formed. In the region where the n-type material is joined to the p-type material, a layer known as the depletion zone is created because the negative electrical charge carriers (electrons) in the n-type material and the positive electrical charge carriers (holes) in the p-type silicon (electrons and holes, respectively) attract and eliminate each other in a process called recombination. By applying a voltage to the p-n junction, the device will provide a flow of electricity in one direction but not in the opposite direction. By way of analogy, diodes (i.e., p-n junctions) are viewed as electrical check valves that are used to turn the flow of electricity ON or OFF. As noted above, a photodiode generates an electrical signal is response to incident light. Energy band diagrams are very often employed as a convenient means for depicting the operation of a p-n junction photodetector.

Referring to FIG. 1, a diagrammatic depiction of a bulk energy band diagram of a conventional photodiode is provided for illustrative purposes. In the horizontal direction, the energy band diagram shows the n-type material 2 at the left (where light is absorbed), depletion region 3 in the middle, and the p-type region 4 at the right. From top-to-bottom, the diagram includes conduction band edge $E_c$, Fermi energy level $E_F$, and valence band edge $E_v$. The conduction band edge $E_c$ may be thought of as a region that is almost empty of electrons, and therefore, electrons may freely move in this region. The valence band edge is a region that may be thought of as being almost full of electrons. Thus, electrons cannot freely move in this region. The Fermi energy level marks a border between energy levels. The energy levels below the Fermi level are substantially full of electrons. The energy levels above the Fermi level are substantially empty of electrons. The energy difference 8 between the conduction band $E_c$ and the valence band $E_v$ is known as the energy gap 8, or the bandgap 8, of the semiconductor. The n-type material bends the conduction edge Ec close to the Fermi level $E_F$. In similar fashion, the p-type material bends the valence band edge Ev close to the Fermi level $E_F$. The "bending" of the energy levels in the diagram 1 show that an electric field E is established in the p-n junction 3.

In conductive materials, the conduction band and the valence band overlap, and therefore, there is no energy gap between these layers and electrons may move freely. In insulators, the conduction band and the valence band are widely separated by an energy gap. Thus, the application of even a large amount of energy will typically not generate a current flow. In semiconductors, the energy gap between the conduction edge Ec and the valence edge Ev is smaller. Because the same semiconductor material is used throughout the junction, the energy gap 8 is shown as a constant distance throughout the junction. In a photodiode, when a predetermined amount of light energy 5 is absorbed by the semiconductor, the energy level of electrons in the material is raised above the conduction band Ec and the energy of holes is below the valence band Ev and the device begins to conduct. Thus, when the semiconductor conducts, electrons 7 will move in the conduction band and holes 6 will move in the valence band. In the n-type material, the "majority carriers" are electrons and the "minority carriers" are holes. In the p-type material, the reverse is true; the majority carriers are holes and the minority carriers are electrons. The intrinsic electric field E exerts a force that tends to move holes 6 generated in the absorption region to the right while moving electrons 7 to the left.

When an external electric field is applied to a photodiode, i.e., when the photodiode is "reverse-biased," the electric field E is greater than the intrinsic electric field and, therefore, the force applied to the electrons 7 and holes 6 is greater. When a photon 5 has an amount of energy greater than the energy gap 8, the energy may excite an electron from the valence band into the conduction band. This creates an electron-hole pair such that electron 7 moves toward the left and hole 6 moves toward the right. At the device level, when the amount of incident light is greater than a predetermined level, electron/hole current will flow through the p-n junction.

One of the issues that detract from the performance of a semiconductor device relates to currents that are not intentionally generated by the device. Clearly, if the device generates extraneous currents, in addition to those generated by photodetection, the sensitivity of the device will be compromised. For example, in certain semiconductors, the energy band gap is relatively small and the introduction of thermal energy can generate a "dark current" in the bulk portion of the device. Another form of dark current is referred to as surface leakage current.

The surface of a compound semiconductor typically has a large density of surface states in a narrow energy range, which pins the surface Fermi level at an energy that is characteristic of the particular semiconductor material. In most large bandgap ($E_G$>1 eV) semiconductors, the surface Fermi level is pinned somewhere in the bandgap, making the surface a semi-insulating depletion layer. Small bandgap semiconductors, such as those used for infrared detectors, often have surface Fermi levels pinned in, or near, one of the bands.

In general, both the magnitude and the type (n-type or p-type) of the conductivity are determined by two factors: the doping for the bulk of a compound semiconductor; and, by the Fermi level pinning for the surface of a semiconductor. The surface conductivity (both type and magnitude) and the bulk conductivity are completely separate phenomenon. For example, regardless of whether the bulk conductivity is p-type or n-type, the surface conductivity type of InAs remains n-type.

In order to fully analyze the bulk and surface currents of a detector, therefore, two energy band diagrams are needed; one energy band diagram is needed for the bulk conductivity and another energy band diagram is required for surface conductivity. The band diagram through the bulk of a conventional photodiode is shown in FIG. 1.

Referring to FIG. 2, a surface energy band diagram of a conventional photodiode having n-type surface conduction is depicted. The energy band diagram shows how surface leakage currents may be generated in photodiodes fabricated using certain semiconductor materials. The Fermi level is shown as being pinned in the conduction band. Thus, the average energy level of the electrons is at an energy state above the conduction band. Because the conduction band may be thought of as a region that is almost empty of electrons, the conventional arrangement exhibits a free path for electrons to flow and unwanted surface leakage current is the result. Those skilled in the art will understand that if the Fermi energy level were shown to be near or below the valence band, a photodiode having p-type surface conduction would be depicted.

Referring to FIG. 3, a perspective view of a conventional InAs photodiode is shown. A common focal plane array (FPA) structure consists of pixels formed of p-n photodiodes processed into mesa structures. Thus, FIG. 3 may be thought of as a single p-n mesa. Bulk currents consist of minority carriers moving across the junction. Bulk current includes diffusion current, tunneling current, photocurrent, and as generation-recombination (g-r) current. The flow of majority carriers across the p-n junction is blocked by its built-in barrier. In the example of FIG. 3, the mesa sidewalls are n-type and have no barriers because of surface Fermi level pinning. As such, the flow of surface leakage current is allowed. Thus, FIG. 3 depicts an "unpassivated" InAs photodiode that suffers from the effects of the surface leakage channel and the resulting free flow of electrons along the surface. Those skilled in the art will understand that in a photodiode having the surface Fermi level at or near the valence band, the mesa sidewalls would be p-type.

FIG. 4 is a diagrammatic depiction of a surface energy band diagram of the conventional InAs photodiode shown in FIG. 1. FIG. 4 is an example illustration of Fermi level pinning in an InAs photodiode. Surface leakage currents can be caused by the pinning of the surface Fermi level or band bending due to stray electric fields at the surface. The latter effect is normally somewhat negligible, however, in small bandgap materials, like those used in long wavelength detectors, and the effects may be significant. As a result, control of surface leakage current is critical to guarantee the best possible device performance. The performance of many types of photodetectors fabricated with multiple types of materials is limited by surface leakage currents. InAs photodetectors typically exhibit surface leakage currents caused by the pinning of the surface Fermi level in the conduction band. This pinning effect results in a surface leakage channel allowing for the free flow of surface electrons, which contributes to the overall dark current and ultimately limits the performance of InAs photodiodes by limiting the specific detectivity.

Heretofore, the discussion has centered on discrete photodiodes. However, photodiodes may be employed in imaging arrays. For example, cooled semiconductor focal plane arrays (FPAs) are the basis of the highest performance infrared imaging technology. FPAs consist of individual pixels fabricated from semiconductor photodetectors, which have low noise and are electrically isolated from neighboring pixels. Surface leakage currents can undermine both of these desired characteristics by adding noise to the individual photodetectors. Surface leakage currents may also create a pixel-to-pixel current path that has a relatively low resistance. The surface leakage currents originate by way of electron states that develop on the surface of air-exposed semiconductor surfaces. Such surface states do not exist in the bulk of the semiconductor, and enable additional conduction paths in parallel to those in the bulk.

Many important types of dark currents, such as diffusion currents and generation-recombination (g-r) currents, are thermally activated processes, which decrease with device temperature. Surface currents, however, are approximately independent of temperature. Many devices can be cooled to decrease diffusion and g-r currents sufficiently so that surface currents become the dominant current, which can then be observed as a temperature-independent current.

In one approach that has been considered, surface passivation treatments are applied to an external portion of the conventional photodiode 1. See FIG. 5. Those of ordinary skill in the art will understand that the application of surface passivation treatments is the conventional approach for controlling surface leakage current. This approach, however, has several drawbacks. For example, the conventional FPA design process can be viewed as occurring in two-steps. First, the epitaxial structure design concentrates on controlling bulk currents and ignores surfaces currents. The aim of such epitaxial designs is to enable the efficient flow of photocurrent and to inhibit (to whatever extent possible) bulk dark currents. Second, attempts to combat surface leakage currents are added as ex-situ processing steps. In other words, the surface passivation treatments are performed after the epitaxial growth, and also after some of the device fabrication steps, whereby a passivation material or treatment is applied to air-exposed surfaces. One disadvantage to this approach relates to the aforementioned additional processing steps that are required. These additional steps add complexity and cost to device manufacturing. Another disadvantage of the ex situ surface passivation treatments is that they are often only partially effective.

What is needed, therefore, is a semiconductor device that substantially eliminates surface leakage currents. What is also needed is a method for in situ manufacturing semiconductor devices that eliminate surface leakage currents. In other words, the method for in situ manufacturing would eliminate the aforementioned second step by fabricating the p-n junction device during epitaxial growth.

SUMMARY OF THE INVENTION

An embodiment of the present invention addresses the needs described above by providing semiconductor devices and assemblies that substantially eliminate surface leakage currents. An embodiment of the present invention addresses the needs described above by providing a method for in situ manufacturing of the aforementioned semiconductor devices that are designed to reduce surface currents, while still producing efficient behaviors of bulk (photo- and dark-) currents. An embodiment of the present invention addresses the needs described above by providing a method that eliminates the need for ex situ surface passivation treatments and their disadvantages by fabricating p-n junction devices and assemblies by using layers that function as unipolar barriers, which allow the flow of one carrier type while blocking the other carrier. When correctly inserted into the epitaxial structure of conventional photodetectors, unipolar barriers can pass bulk photocurrents but block surface leakage currents. The use of epitaxial unipolar barriers for suppression of surface passivation is illustrated here in InAs-based materials. Those of ordinary skill in the art will understand that the teachings of the present invention may be implemented in other infrared materials, such as type II superlattices, InSb and HgCdTe.

One aspect of the present invention is directed to a semiconductor device that includes at least one p-n junction including a p-type material, an n-type material, and a depletion region. The at least one p-n junction is configured to generate bulk photocurrent in response to incident light. The at least one p-n junction is characterized by a conduction band energy level, a valence band energy level and a surface Fermi energy level. The surface Fermi energy level is pinned either near or above the conduction band energy level or near or below the valence band energy level. A unipolar barrier structure is disposed in a predetermined region within the at least one p-n junction. The unipolar barrier is configured to raise the conduction band energy level if the surface Fermi energy level is pinned near or above the conduction band energy level or lower the valence band energy level if the surface Fermi energy level is pinned near or below the valence band energy level such that the unipolar barrier is configured to propagate the bulk photocurrent and substantially block surface leakage current. The at least one p-n junction and the unipolar barrier are integrally formed.

In another aspect, the present invention is directed to a method for making a semiconductor device. The method includes forming an n-type material and forming a p-type material. The p-type material and the n-type material form at least one p-n junction having a depletion region. The at least one p-n junction is configured to generate bulk photocurrent is response to incident light. The at least one p-n junction is characterized by a conduction band energy level, a valence band energy level and a surface Fermi energy level. The surface Fermi energy level is pinned either near or above the conduction band energy level or near or below the valence band energy level. The method further includes forming a unipolar barrier structure in a predetermined region within the at least one p-n junction. The unipolar barrier is configured to raise the conduction band energy level if the surface Fermi energy level is pinned near or above the conduction band energy level or lower the valence band energy level if the surface Fermi energy level is pinned near or below the valence band energy level such that the unipolar barrier is configured to propagate the bulk photocurrent and substantially block surface leakage current. The n-type material, the p-type material and the unipolar barrier are integrally formed by the method for making the semiconductor device.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention and together with the description serve to explain the principles and operation of the invention.

DETAILED DESCRIPTION

Figure 1:
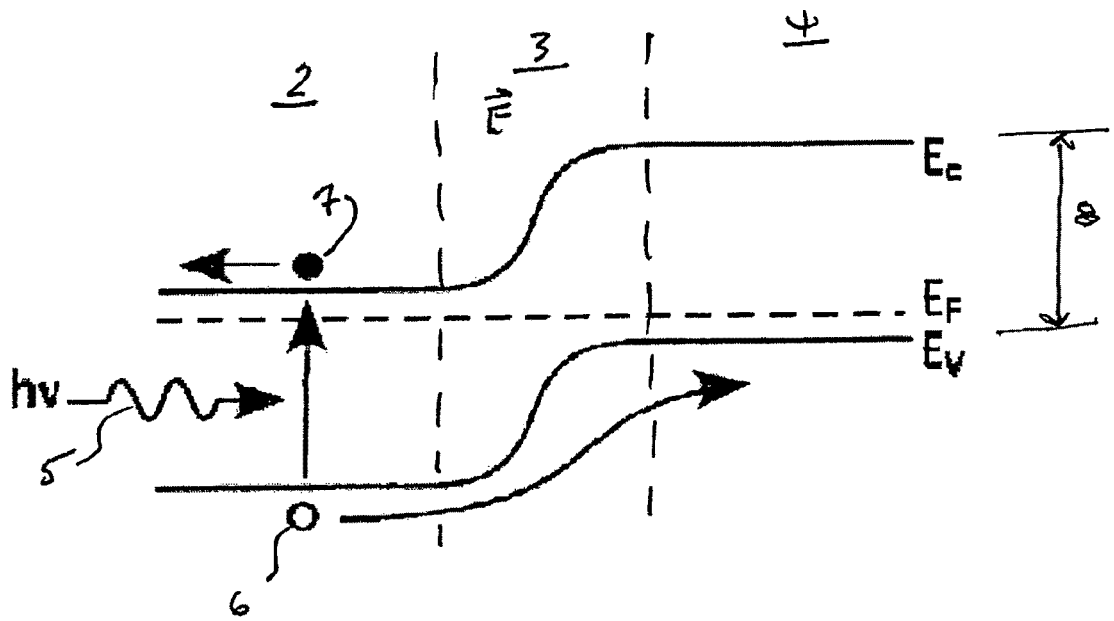
FIG. 1 is a diagrammatic depiction of a bulk energy band diagram of a conventional photodiode.
Figure 2:
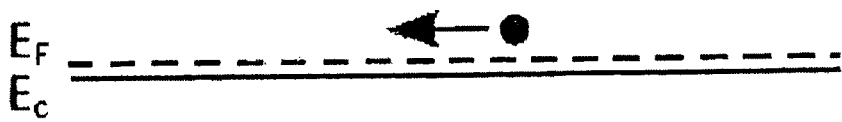
FIG. 2 is a diagrammatic depiction of a surface energy band diagram of the conventional photodiode depicted in FIG. 1.
Figure 2:
Figure 3:
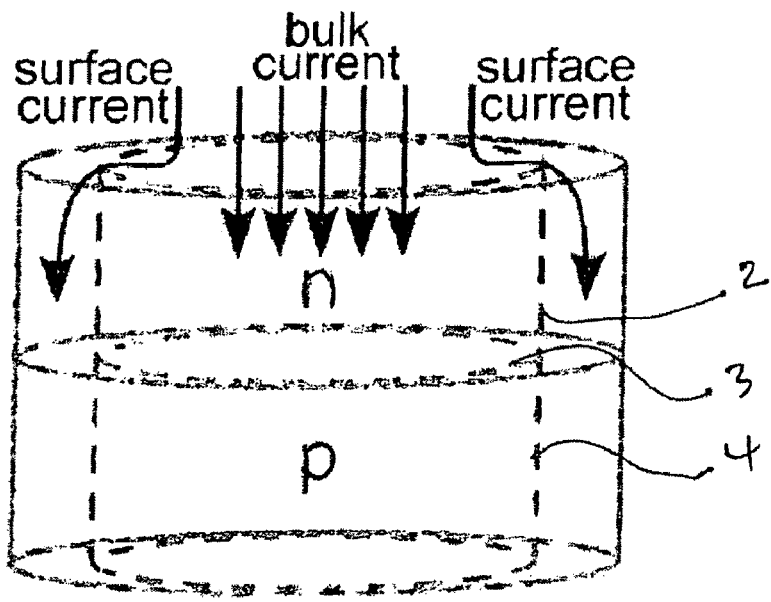
FIG. 3 is a perspective view of a conventional photodiode depicted in FIG. 1.
Figure 4:
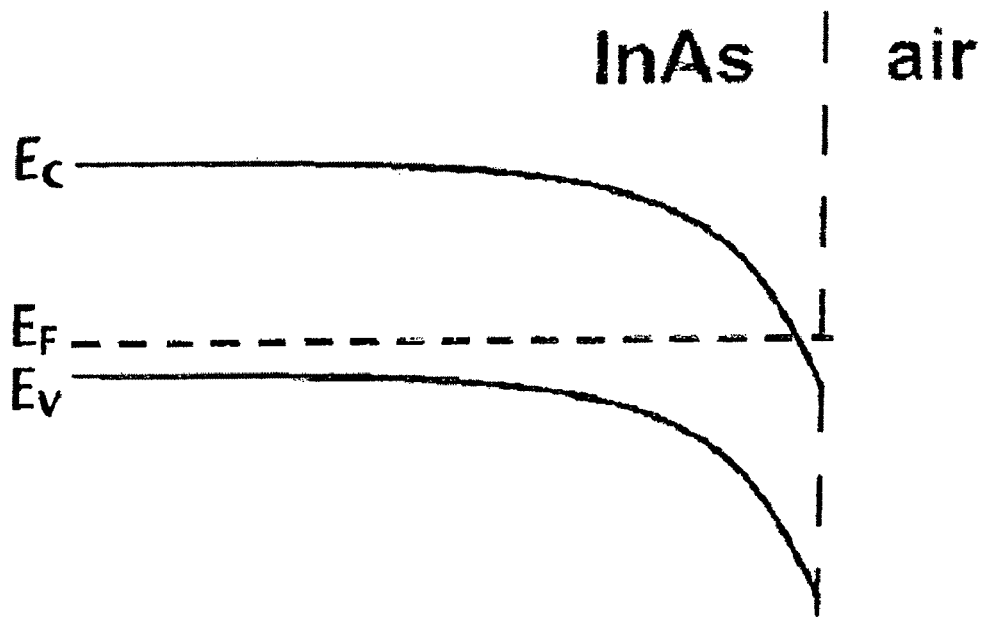
FIG. 4 is a diagrammatic depiction of a surface energy band diagram of a conventional InAs photodiode illustrating Fermi level pinning.
Figure 5:
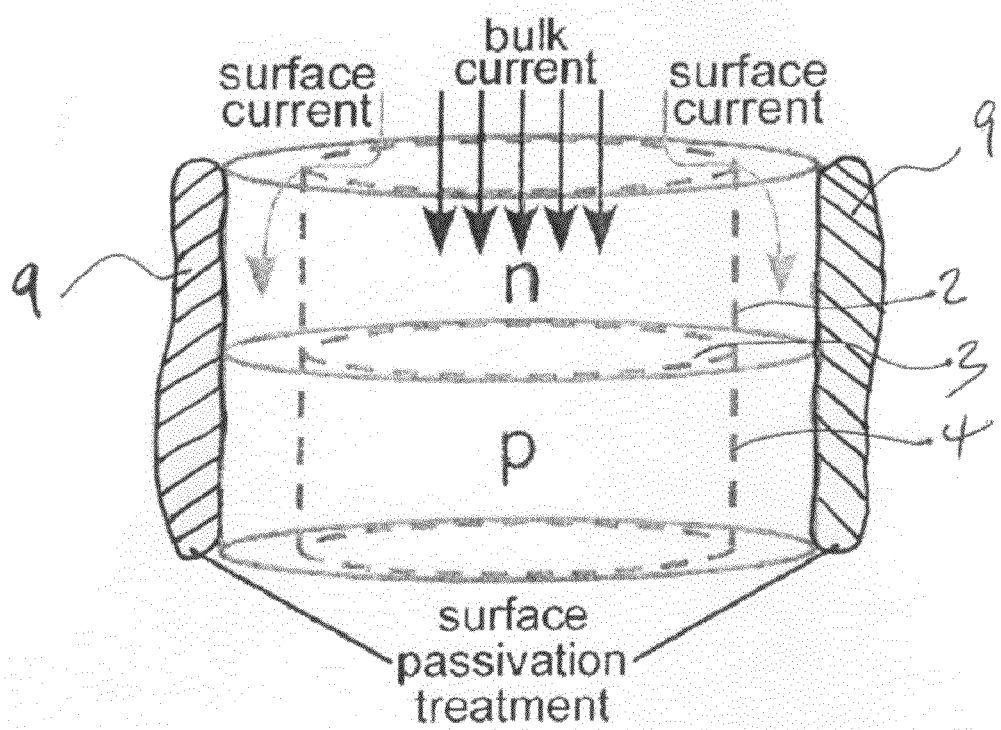
FIG. 5 is a perspective view of the conventional InAs photodiode depicted in FIG. 4 with surface passivation treatment.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the semiconductor device of the present invention is shown in FIG. 6, and is designated generally throughout by reference numeral 10.

Figure 6:
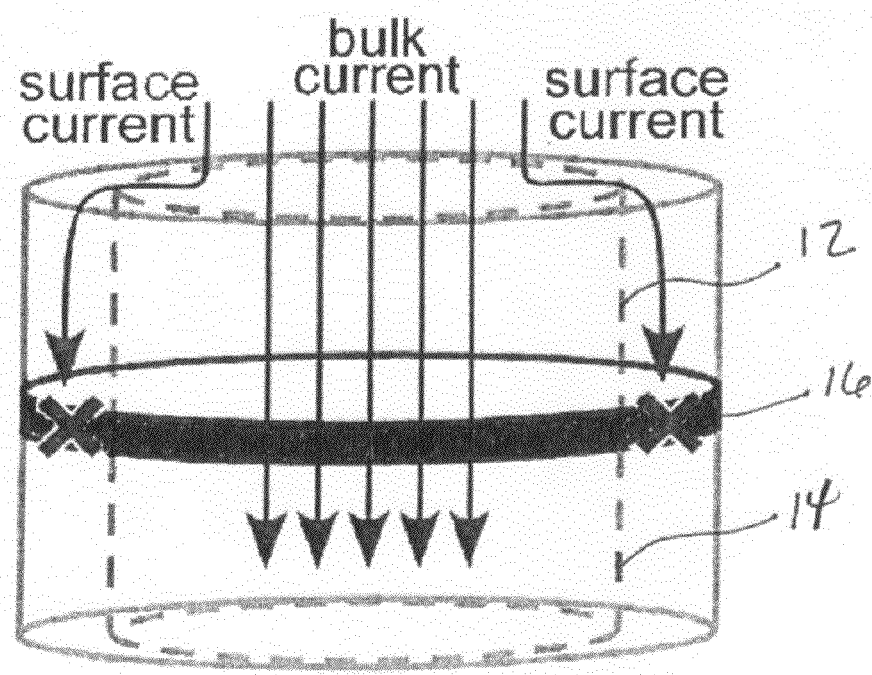
FIG. 6 is a perspective view of a photodiode with a unipolar barrier in accordance with an embodiment of the present invention.

As embodied herein and depicted in FIG. 6, a perspective view of a semiconductor device 10 in accordance with an embodiment of the present invention is disclosed. Semiconductor device 10 includes n-type material 12, p-type material 14 and a unipolar barrier layer 16 that is formed within the semiconductor device structure. As shown schematically in FIG. 6, the unipolar barrier 16 is configured with the necessary surface characteristics to block the flow of surface leakage current and is also configured with the necessary bulk characteristics to enable the flow of (bulk) photocurrent. This arrangement ensures that material defects are minimized and there is no barrier or well in the valence band to impede the flow of hole currents. On one hand, if the unipolar barrier structure is to block the flow of electrons (and pass holes), it must have a band gap larger than the surrounding material, while simultaneously maintaining the zero valence band barrier. If these conditions are met, the barrier can pass photogenerated carriers while substantially blocking all of the surface leakage current. On the other hand, if the unipolar barrier structure is to block the flow of holes (and pass electrons), it must have a band gap larger than the surrounding material, while simultaneously maintaining the zero conduction band bather. If these conditions are met, the barrier can pass photogenerated carriers while substantially blocking all of the surface leakage current.

It will be apparent to those of ordinary skill in the pertinent art that modifications and variations can be made to semiconductor device 10 of the present invention depending on the application. For example, semiconductor device 10 may be configured as a discrete device or part of an array of devices, e.g. such as an FPA. Further, the semiconductor device 10 may be implemented such that the application of an applied voltage may or may not be required.

In InAs photodetectors, for example, the surface current is always carried by electrons. However, as in all photodetectors that use optical creation of electron-hole pairs by band-to-band transitions, the photocurrent is carried partially by holes and partially by electrons. The photocurrent is electron current from one terminal of the device to the point of optical absorption, whereas the photocurrent is hole current from the point of absorption to the other terminal. A key consideration in designing unipolar barrier 16 is to insert the barrier at a location in the device where the photocurrent is the carried by the carrier type that does not carry the surface current. In other words, by designing the unipolar barrier 16 to pass bulk holes and substantially block surface electrons, the photocurrent is unimpeded while the surface current is suppressed.

The use of epitaxial unipolar barriers for suppression of surface passivation is illustrated herein by using illustrative examples that feature InAs-based materials. It will be apparent to those of ordinary skill in the pertinent art that the teachings of the present invention may be implemented using any suitable semiconductor materials, e.g., such as type II superlattices, InSb and HgCdTe. Unipolar barrier 16 is engineered so that it allows one type of carrier to flow, but impedes the flow of the other carrier in a semiconductor heterostructure. In the case of an electron blocking unipolar barrier, the barrier material must be carefully chosen to ensure a zero valence band offset between the barrier and the surrounding material(s) as well as pseudomorphic characteristics at a viable barrier thickness. Alternately, an electron blocking unipolar barrier could be constructed by grading a p-type material from a low band gap semiconductor, to a high band gap semiconductor, and back down to a low band gap semiconductor. This would result in a mixed semiconductor that gradually phases from one material to the next and back again. The material must also be engineered to have a band gap that is sufficiently larger than that of the other material(s) in the heterostructure to ensure the effectiveness of the barrier. If these conditions are met, the unipolar barrier will effectively block one carrier while neither presenting a barrier nor a well to impede the flow of the other carrier. Those of ordinary skill in the art will also understand that the present invention may be implemented using other in situ processes for fabricating semiconductor devices.

It should also be mentioned once again, that the present invention is also directed to constructing a hole blocking unipolar barrier. In this embodiment, the barrier material must be carefully chosen to ensure a zero conduction band offset between the barrier and the surrounding material(s). Again, a hole blocking unipolar barrier could be constructed by grading an n-type material from a low band gap semiconductor, to a high band gap semiconductor, and back down to a low band gap semiconductor. This would result in a mixed semiconductor that gradually phases from one material to the next and back again.

Figure 7:
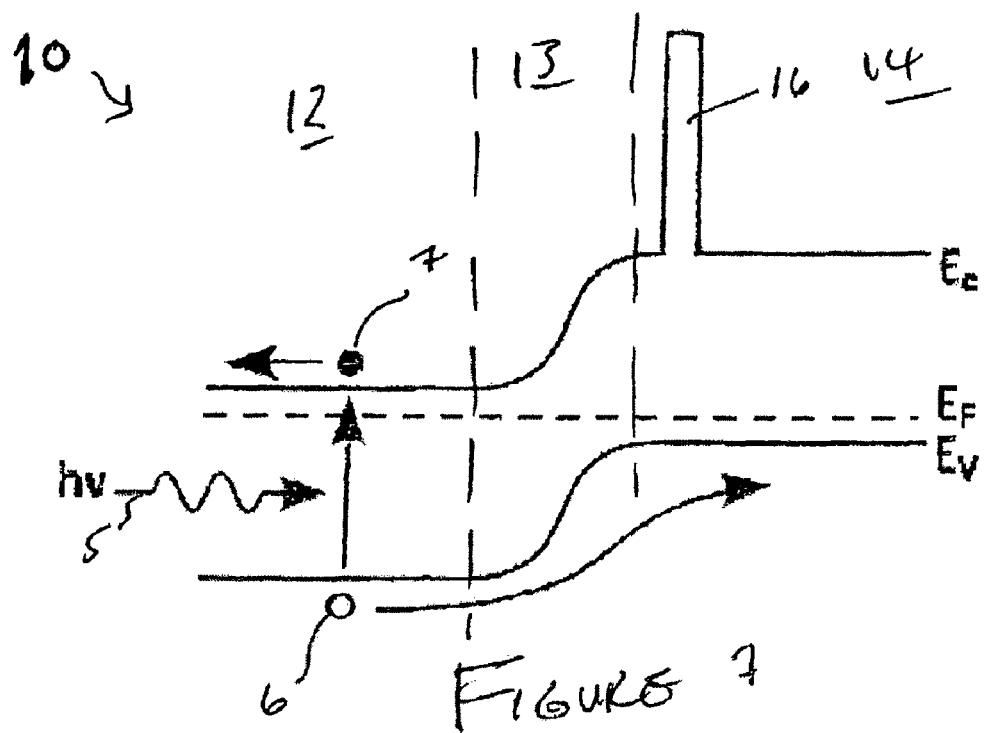
FIG. 7 is a cross-sectional diagrammatic view of the photodiode with the unipolar bather depicted in FIG. 6.

Referring to FIG. 7, a bulk energy band diagram of the photodiode 10 with a unipolar barrier 16 depicted in FIG. 6 is disclosed. The unipolar barrier 16 does not impede the photocurrent in the bulk band diagram, but it bather 16 blocks the surface leakage current carried by electrons.

Figure 8:
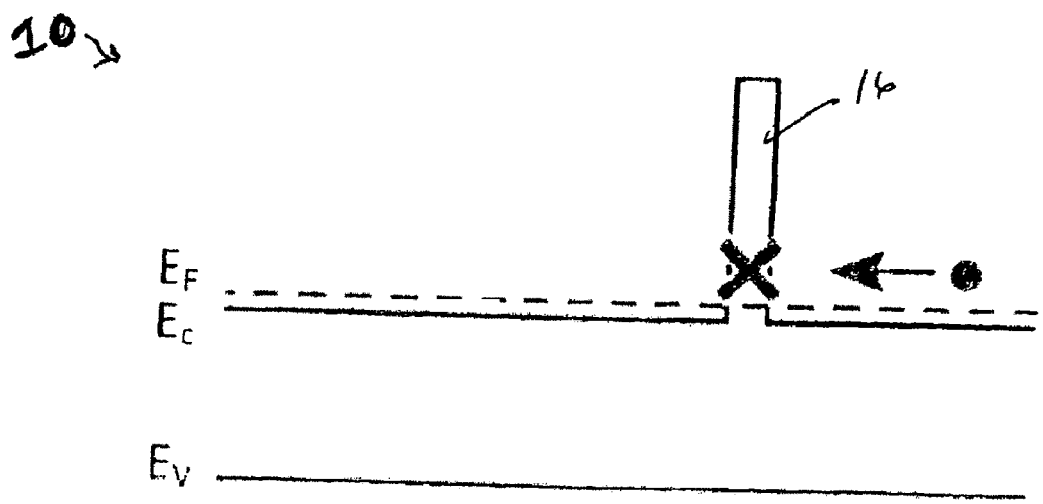
FIG. 8 is a diagrammatic depiction of surface band alignments corresponding to the photodiode depicted in FIG. 7.

Referring to FIG. 8, the surface band diagram of the unipolar barrier photodiode 10 is identical to a conventional photodiode except that it includes the barrier layer 16. As shown schematically in FIG. 8, this arrangement of the unipolar barrier photodiode 10 has a distinct advantage over a conventional photodiode in that it naturally suppresses surface leakage currents through an epitaxial layer but does not interfere with the flow of photogenerated carriers. In the generic example of FIGS. 7 and 8, the unipolar barrier photodiode applies a minority carrier unipolar barrier to the p-type region of a p-n junction to block the flow of surface currents but allow the photoelectrons generated deep in the n-type layer to flow freely. The photodiode of this illustrative example is designed to absorb the light in the n-layer. Photogenerated electrons diffuse from the point of optical absorption, away from the p-n junction, to the n-contact; photogenerated holes diffuse toward the p-n junction, where they are swept to the p-side and exit at the p-contact.

EXAMPLES

The invention will be further clarified by the following examples which are intended to be exemplary of the invention.

Example 1

Figure 9:
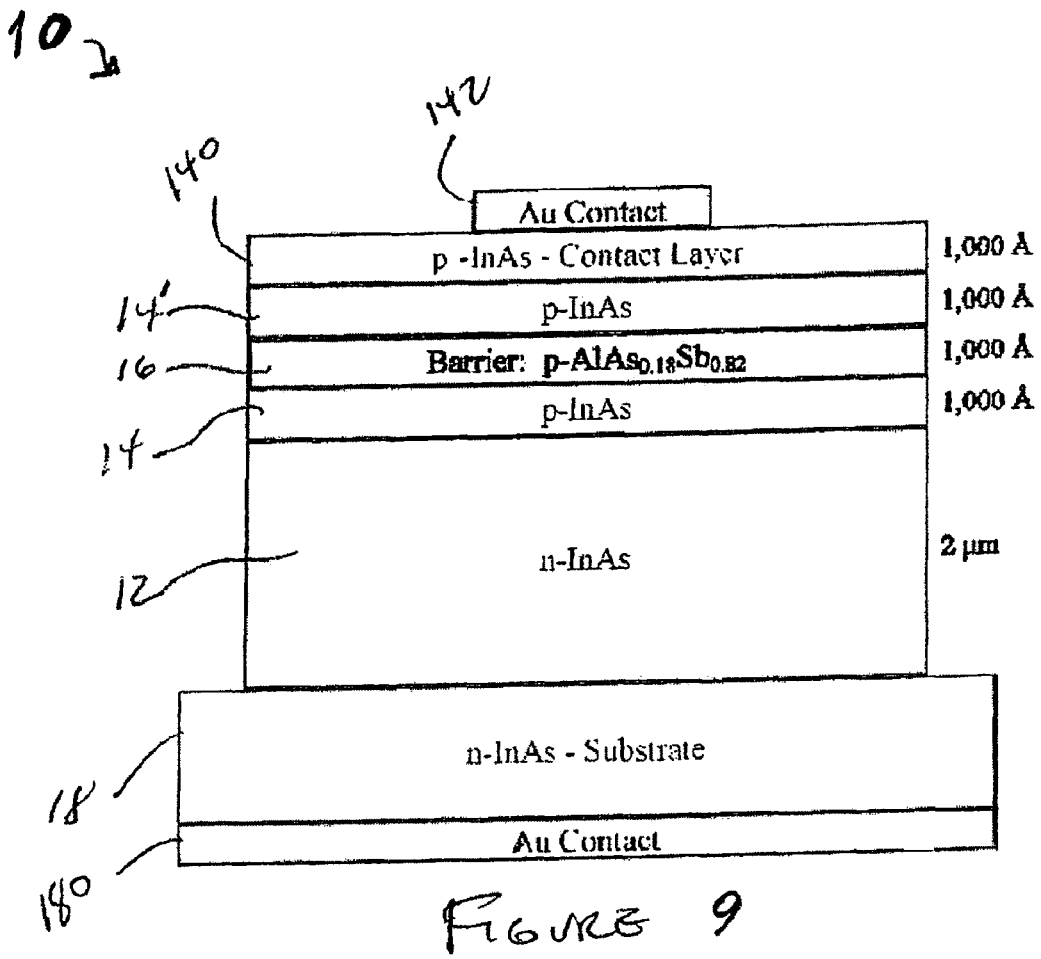
FIG. 9 is a diagrammatic depiction of a bulk energy band diagram of the photodiode with a unipolar barrier depicted in FIG. 6.

As embodied herein and depicted in FIG. 9, a cross-sectional diagrammatic view of an InAs photodiode 10 with a unipolar barrier 16 in accordance with one embodiment of the invention is disclosed. In this embodiment, $AlAs_{0.18}Sb_{0.82}$ has been identified as a suitable unipolar barrier material for InAs semiconductor devices. The photodiodes 10 of the present invention were grown by solid source molecular beam epitaxy (MBE) by a Riber 32P system utilizing $As_2$ and $Sb_4$. First, the devices were grown on unintentionally doped, n-type InAs substrates 18, which were disposed on a gold contact material 180. Next, a 2 μm, unintentionally doped n-type InAs layer 12 having a carrier concentration of $n \approx 10^{16}$ $cm^{-3}$ was deposited on substrate 18. This step was followed by depositing a p-type layer 14. P-type layer 14 is formed by a 1,000 Å (angstrom) layer of beryllium doped p-type InAs with a carrier concentration of $p \approx 10^{18}$ $cm^{-3}$. At this point in the process, a growth stop of about 2 minutes followed under continuous $As_2$ flux while the substrate temperature was raised approximately 50° C. for growing a 1,000 Å $AlAs_{0.18}Sb_{0.82}$ unipolar bather layer 16. The barrier layer 16 was doped with the same beryllium flux used to dope the InAs p-type material. A five (5) minute growth stop followed under both $As_2$ and $Sb_4$ fluxes while the temperature was returned to the InAs growth temperature. Another 1,000 Å of additional Beryllium doped p-type InAs was deposited to form the p-type material layer 14' of the p-n junction. Next, a 1,000 Å layer of $p^+$-type InAs forms contact layer 140. In layer 140, the doping level was graded from $p \approx 10^{18}$ $cm^{-3}$ to a maximum doping concentration of $p \approx 10^{19}$ $cm^{-3}$. To complete the device, a gold contact layer 142 is formed on p-type contact layer 140.

The device structure and growth parameters for the MBE-grown unipolar barrier photodiodes are shown in Table I.

TABLE I

| Layer | Material | Thickness | Growth Temperature | Growth Rate |
|---|---|---|---|---|
| n-type | InAs:nd | 2 μm | 420° C. | 1.0 ML/s |
| p-type | InAs:Be | 1,000 Å | 420° C. | 1.0 ML/s |
| Barrier | $AlAs_{0.18}Sb_{0.82}$:Be | 1,000 Å | 465° C. | 1.0 ML/s |
| p-type | InAs:Be | 1,000 Å | 420° C. | 1.0 ML/s |
| $p^+$-type Contact | InAs:Be | 1,000 Å | 420° C. | 1.0 ML/s |

Structurally identical conventional photodiodes were grown with the bather omitted. The conventional photodiode was grown at the same temperatures, doping levels, and layer thicknesses, except with the barrier material and corresponding growth stops omitted. Both the conventional photodiodes and unipolar barrier photodiodes are abrupt junction devices. Table 1 lists the device layer materials, growth temperatures, and growth rates. All growth temperatures were measured using a pyrometer, and the growth rates were calibrated using RHEED oscillations performed during a separate growth.

Figure 10:
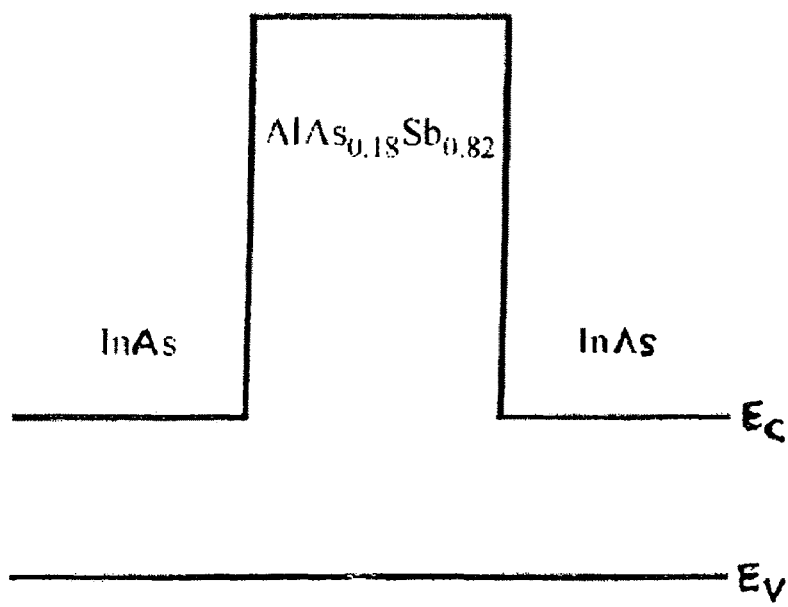
FIG. 10 is a diagrammatic depiction of a bulk energy band diagram of the photodiode with a unipolar barrier depicted in FIG. 6.

Referring to FIG. 10, an energy band diagram corresponding to the embodiment depicted in FIG. 9 is disclosed. The diagram shows unipolar barrier 16 that passes bulk-hole current while blocking surface-electrons. As noted above, unipolar barrier 16 is constructed of a material that is a close lattice-match to InAs. Unipolar barrier 16 forms a heterojunction with InAs that has no valence band barrier, a large conduction band barrier, and has its surface Fermi level pinned inside its bandgap. As noted above, one material that meets all these characteristics is $AlAs_{0.18}Sb_{0.82}$. The bulk band alignment of an $AlAs_{0.18}Sb_{0.82}$ layer inserted inside InAs forms a unipolar barrier, i.e., a layer 16 that enables holes to pass but blocks surface electrons.

Figure 11:
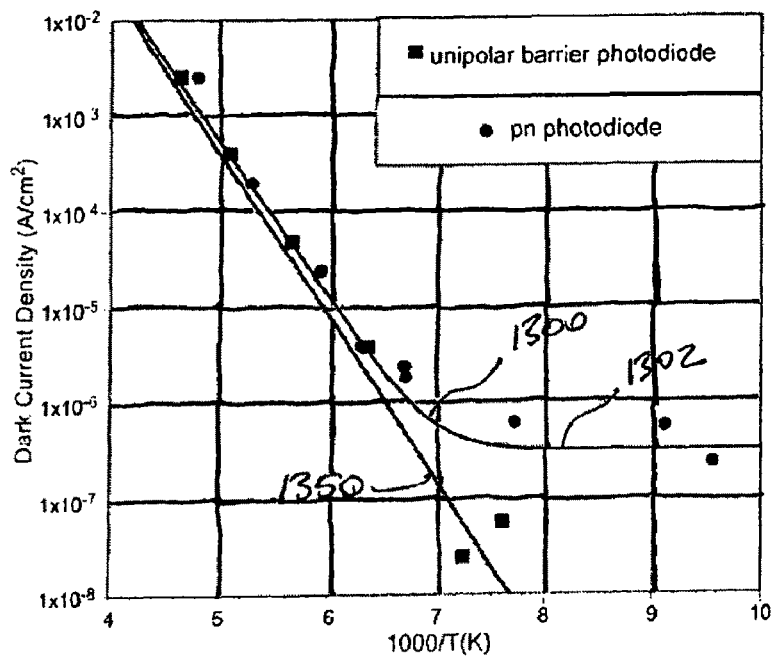
FIG. 11 is a chart showing dark current as a function of reciprocal temperature for both a conventional photodiode and a photodiode having a unipolar barrier.

FIG. 11 is a chart showing dark current as a function of reciprocal temperature for both a conventional InAs photodiode and the InAs unipolar photodiode described herein. The dark current density of both devices is defined as the current divided by the device mesa area, and is plotted as a function of reciprocal temperature. The current shown in the chart of FIG. 11 represents the reverse saturation current of the detectors taken at a nominal reverse voltage. At higher temperatures, the two types of photodiodes have similar dark currents, both of which are diffusion currents with thermal activation energies approximately equal to the InAs bandgap. On one hand, as the device temperature is decreased to about 150K and below, the conventional p-n photodiode becomes limited by temperature-independent surface leakage current. On the other hand, the curve of the unipolar barrier photodiode (1350) shows no signs of surface leakage current down to the noise floor limit. Thus, the performance of device 10 of the present invention is noticeably better than the performance of the conventional diode below 150° K. FIG. 11 demonstrates that the dark current limit in the unipolar barrier photodiode 10 is at least 20 times lower than the dark current limit in a comparable conventional photodiode 1. Dark currents are related to noise through the standard shot noise model. A reduction of the dark current by a factor of 20 corresponds to a decrease in noise currents by a factor of $\sqrt{20}$.

Figures 12A, 12B:
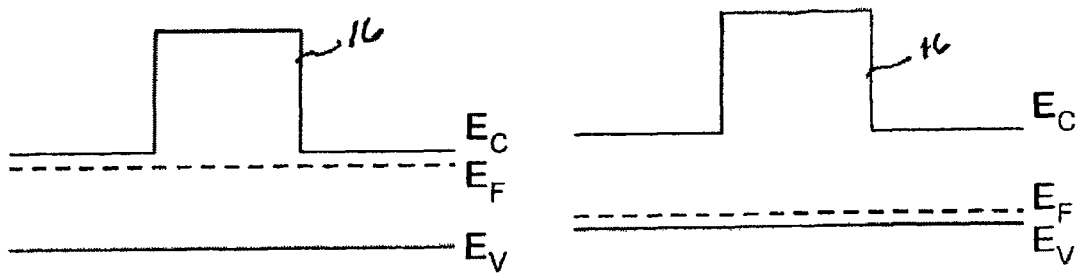
FIGS. 12A and 12B are alternate detail views of the surface band alignment diagram depicted in FIG. 8.

Referring to FIG. 12A, an alternate detail view of the energy band diagram depicted in FIG. 8 is disclosed. In this embodiment, a unipolar barrier 16 of the type is employed when the low bandgap (optical absorber) material has its surface Fermi-level in or near the conduction band. As explained above, this arrangement creates electrons on the surface. Thus, barrier 16 blocks the electrons that are the cause of the unwanted surface leakage currents. In FIG. 12A, the unipolar barrier 16 is disposed in the n-type material 12. In FIG. 12B, the unipolar barrier is disposed in the p-type material 14. FIG. 12B is very similar to the diagram depicted in FIG. 8.

Figure 13A:
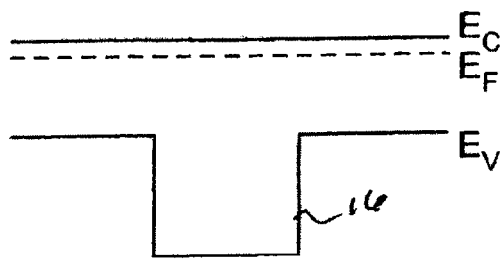
FIG. 13A and FIG. 13B are alternate detail views of the surface band alignment diagram depicted in FIG. 8 in accordance with yet another embodiment of the present invention.
Figure 13B:
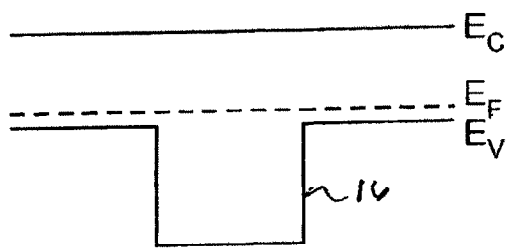

Referring to FIG. 13A and FIG. 13B, alternate detail views of the surface band alignment diagram depicted in FIG. 8 in accordance with yet another embodiment of the present invention is disclosed. This type of barrier 16 is used when the low bandgap (optical absorber) material has its surface Fermi-level in or near the valence band. This arrangement creates holes on the surface that carry leakage currents. In FIG. 13A, unipolar barrier 16 is formed in the n-type material 12. In FIG. 13B, the unipolar barrier 16 is formed in the p-type material 14.

As noted above, various base semiconductor materials may be employed in the present invention. The base semiconductors, in turn, may be employed with one or more unipolar barrier materials in accordance with the teachings of the present invention. In the examples described above, an InAs semiconductor device was fabricated using an AlAsSb unipolar barrier. InAs devices may also include unipolar barrier layers fabricated using materials such as AlGaSb, AlGaAsSb, GaInAs, AlInAs, AlGaInAs, or a superlattice material.

For devices fabricated using a GaInAs base semiconductor material, the unipolar barrier layer may be fabricated using AlAsSb or AlGaAsSb. Further, GaInAs devices may also include higher bandgap materials for the unipolar barrier layer. Examples of such materials include GaInAs, AlInAs, AlGaInAs, InP, or a superlattice material.

The semiconductor devices of the present invention may also use InAsSb as a base semiconductor. In this case, the unipolar layer may be fabricated using GaSb, AlGaSb, AlSb, AlAsSb, or AlGaAsSb. Higher bandgap materials such as InAsSb, GaInAs, or a superlattice may also be employed.

When InSb is used as the base semiconductor, the unipolar bather layer may be formed using GaSb, AlGaSb, AlSb, InAs, or a superlattice material. HgCdTe may also be used as the base semiconductor. In this example, the unipolar layer may be formed using higher bandgap materials such as HgCdTe, HgCdSe, HgCdZnTe, CdZnTe, ZnTe, HgZnTe, HgMnTe, MnTe, or a superlattice material.

For type II superlattice base semiconductors, the unipolar barrier layer may be fabricated using GaSb, AlGaSb, AlSb, InAs, higher bandgap versions of the type II superlattice, or a different superlattice material.

The methods described heretofore require two materials with very specific band alignments. Either the valence or conduction bands of the two materials must be substantially in alignment with each other. Finding suitable materials with the required band alignments may be challenging.

In another embodiment of the present invention, which was alluded to above, the aforementioned material restrictions may be relaxed somewhat. In this embodiment, a low bandgap/high bandgap pair of materials with any arbitrary relationship of their conduction and valence bands may be employed. As noted previously, the electron blocking unipolar barrier 16 is constructed by "mixing" semiconductor materials such that the composite structure gradually phases from one material to the next and back again. For example, a p-type material may be graded from a low band gap semiconductor, to a high band gap semiconductor, and back down again to a low band gap semiconductor. This results in a mixed semiconductor unipolar barrier 16. The material must also be engineered to have a band gap that is sufficiently larger than that of the other material(s) in the heterostructure to ensure the effectiveness of the barrier 16. If these conditions are met, the unipolar barrier will effectively block one carrier while neither presenting a barrier nor a well to impede the flow of the other carrier.

Figure 14A:
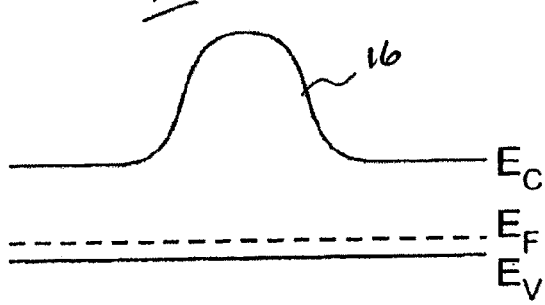
FIG. 14A and FIG. 14B are surface band diagrams illustrating graded unipolar barriers in accordance with another embodiment of the present invention.
Figure 14B:
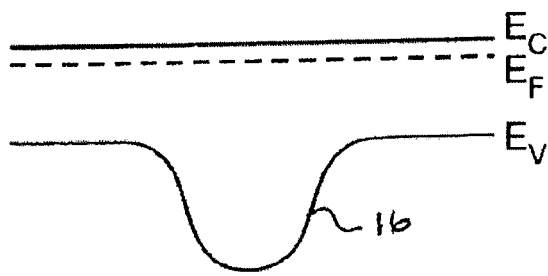

As embodied herein and depicted in FIG. 14A and FIG. 14B, surface band diagrams illustrating graded unipolar barriers in accordance with another embodiment of the present invention are disclosed. FIG. 14A shows a graded unipolar barrier 16 formed in p-type material 14. In this case, the unipolar barrier 16 is formed by grading from the low bandgap p-type material to the high bandgap p-type material to form an electron barrier. Of course, the electron barrier structure is used when the low bandgap (optical absorber) material has its surface Fermi-level in or near the conduction band, which creates electrons on the surface to carry leakage currents. FIG. 14B shows a graded unipolar barrier 16 formed in n-type material 12. Here, the unipolar barrier 16 is formed by grading from the low bandgap n-type material to the high bandgap n-type material and back again to form a hole barrier. As before, the hole barrier structure is used when the low bandgap (optical absorber) material has its surface Fermi-level in or near the valence band, which creates holes on the surface to carry leakage currents.

The method described in relation to FIGS. 14A-B may be advantageous because it is able to use any pair of low bandgap/high bandgap materials and is, therefore, not restricted to the materials matching requirements for aligning valence bands or conduction bands.

Figure 15:
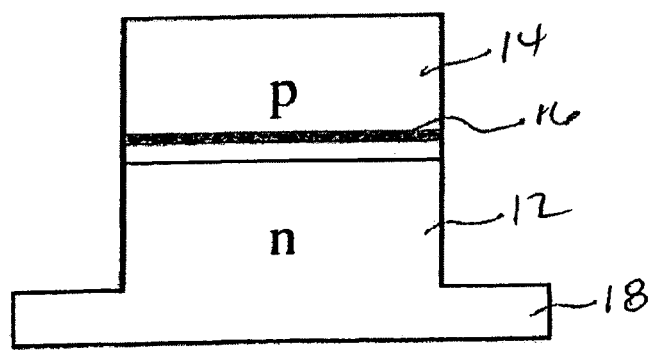
FIG. 15 is a cross-sectional diagrammatic view of a photodiode with a graded unipolar bather as depicted in FIG. 14A.

FIG. 15 is a cross-sectional diagrammatic view of a photodiode with a graded unipolar barrier 16 as depicted in FIG. 14A. Instead of matching materials, the unipolar barrier 16 is formed by "mixing" the low bandgap materials with the high bandgap materials to form the grading depicted in FIG. 14A. Once the N-type material 12 is deposited over the n-type substrate 18, the low bandgap material is deposited until the grading process begins. Over time, more and more high band gap material is added until the apex of the graded barrier 16 is reached. At that point, less and less high band gap material is added until the barrier structure is completed. At this point, the process resumes the deposition of the p-type material 14 until the semiconductor structure is completed.

Figure 16:
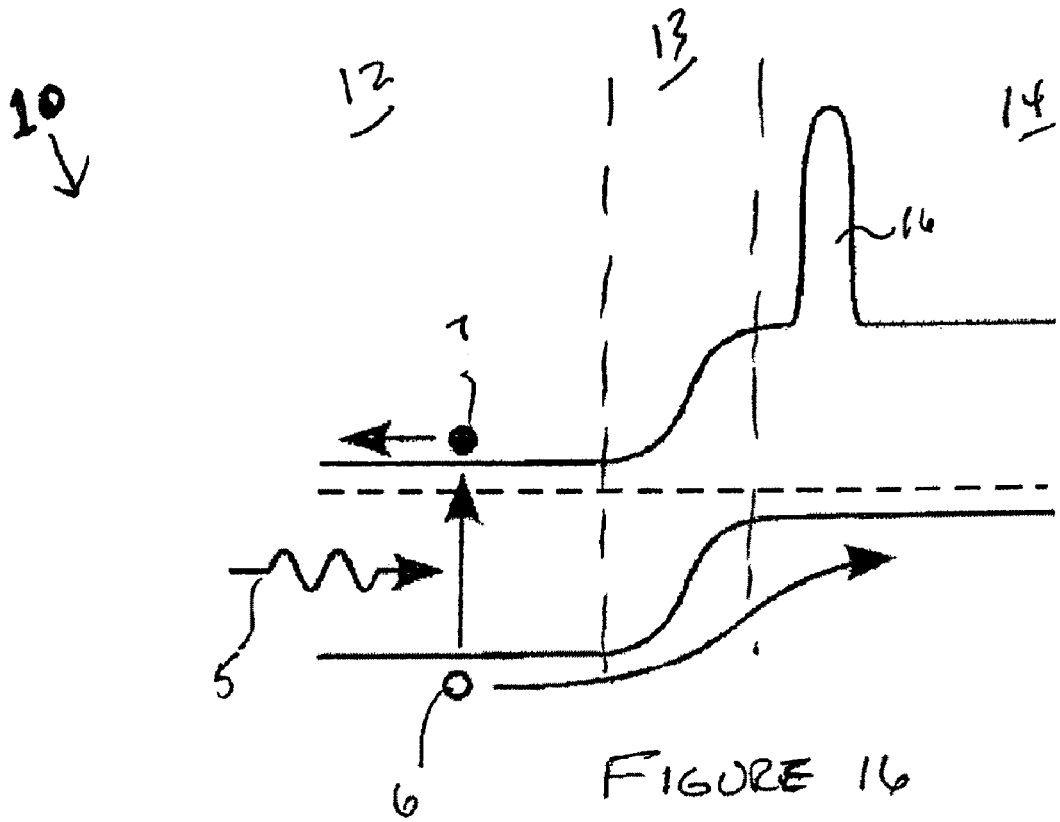
FIG. 16 is a cross-sectional diagrammatic view of the photodiode with the graded unipolar bather depicted in FIG. 15.

As embodied herein and depicted in FIG. 16, a bulk band diagram of photodiode with graded electron barrier in p-layer depicted in FIG. 15 is disclosed. The diagram of FIG. 16 is similar to that depicted in FIG. 7. The difference between the two Figures is the graded unipolar bather 16 depicted in FIG. 16. Note that bulk photocurrent is unimpeded by the bather 16.

Figure 17:
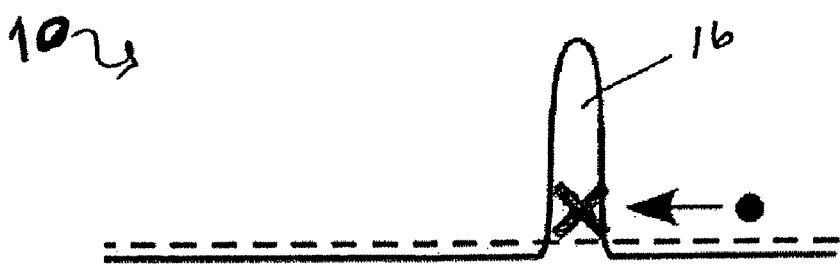
FIG. 17 is a diagrammatic depiction of surface band alignments corresponding to the photodiode depicted in FIGS. 15 and 16.

Referring to FIG. 17, a diagrammatic depiction of surface band alignments corresponding to the photodiode depicted in FIGS. 15 and 16. The material of this photodiode has its surface Fermi-level at/near the conduction band. The surface band diagram of photodiode 10 includes a graded electron barrier 16 in the p-layer.

The unipolar semiconductor devices of the present invention allow desirable photocurrent to flow while effectively blocking the flow of surface current. Thus, the present invention eliminates the need for surface passivation treatments. The unipolar semiconductor devices of the present invention eliminate the additional time, cost, and complexity associated with implementing state-of-the-art passivation techniques used in the fabrication of conventional devices. The result is a detector that is both inexpensive and easier to produce. At the same time, the present invention exhibits a performance that is far superior than the conventional devices. For example, the unipolar barrier photodiode of the present invention exhibits a dark current lower limit at least 20 times lower than that of a conventional photodiode. The epitaxial approach of incorporating unipolar bathers may useful in other devices, both inside and outside of photonics, where surface passivants are required for the best possible device performance.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A semiconductor device comprising:
   at least one p-n junction including a p-type material, an n-type material, and a depletion region, the at least one p-n junction being configured to generate bulk photocurrent in response to incident light, the at least one p-n junction being characterized by a conduction band energy level, a valence band energy level and a surface Fermi energy level, the surface Fermi energy level being pinned either near or above the conduction band energy level or near or below the valence band energy level; and
   a unipolar barrier structure disposed in a predetermined region within the at least one p-n junction, the unipolar barrier being configured to raise the conduction band energy level if the surface Fermi energy level is pinned near or above the conduction band energy level or lower the valence band energy level if the surface Fermi energy level is pinned near or below the valence band energy level such that the unipolar barrier is configured to propagate the bulk photocurrent and substantially block surface leakage current, the at least one p-n junction and the unipolar barrier being integrally formed.

2. The device of claim 1, wherein the at least one p-n junction is configured as a photodiode.

3. The device of claim 1, wherein the at least one p-n junction is configured as a focal plane array.

4. The device of claim 1, wherein the at least one p-n junction includes a plurality of p-n junctions.

5. The device of claim 1, wherein the unipolar barrier is disposed in the n-type material.

6. The device of claim 1, wherein the unipolar barrier is disposed in the p-type material.

7. The device of claim 1, wherein the unipolar barrier is disposed between the n-type material and the p-type material.

8. The device of claim 1, wherein the unipolar barrier is disposed in the n-type material and the surface leakage current being blocked is comprised of electrons.

9. The device of claim 1, wherein the unipolar barrier is disposed in the p-type material and the surface leakage current being blocked is comprised of electrons.

10. The device of claim 1, wherein the unipolar barrier is disposed in the n-type material and the surface leakage current being blocked is comprised of holes.

11. The device of claim 1, wherein the unipolar barrier is disposed in the p-type material and the surface leakage current being blocked is comprised of holes.

12. The device of claim 1, wherein the at least one p-n junction is comprised of an InAs semiconductor material.

13. The device of claim 12, wherein the unipolar barrier is fabricated from a material selected from a group of materials including AlAsSb, AlGaSb, AlGaAsSb, GaInAs, AlInAs, AlGaInAs, or a superlattice material.

14. The device of claim 1, wherein the at least one p-n junction is comprised of a GaInAs semiconductor material.

15. The device of claim 14, wherein the unipolar barrier is fabricated from a material selected from a group of materials including AlAsSb, AlGaAsSb, GaInAs, AlInAs, AlGaInAs, InP, or a superlattice material.

16. The device of claim 1, wherein the at least one p-n junction is comprised of an InAsSb semiconductor material.

17. The device of claim 16, wherein the unipolar barrier is fabricated from a material selected from a group of materials including GaSb, AlGaSb, AlSb, AlAsSb, AlGaAsSb, InAsSb, GaInAs, or a superlattice material.

18. The device of claim 1, wherein the at least one p-n junction is comprised of an InSb semiconductor material.

19. The device of claim 18, wherein the unipolar barrier is fabricated from a material selected from a group of materials including GaSb, AlGaSb, AlSb, InAs, or a superlattice material.

20. The device of claim 1, wherein the at least one p-n junction is comprised of an HgCdTe semiconductor material.

21. The device of claim 20, wherein the unipolar barrier is fabricated from a material selected from a group of materials including HgCdTe, HgCdSe, HgCdZnTe, CdZnTe, ZnTe, HgZnTe, HgMnTe, MnTe, or a superlattice material.

22. The device of claim 1, wherein the at least one p-n junction is comprised of a type II superlattice semiconductor material.

23. The device of claim 22, wherein the unipolar barrier is fabricated from a material selected from a group of materials including GaSb, AlGaSb, AlSb, InAs, higher bandgap versions of the type II superlattice material, or a different superlattice material.

24. The device of claim 1, wherein the surface Fermi energy level is pinned either near or above the conduction band energy level and the unipolar bather is configured to raise the conduction band energy level such that the bulk photocurrent is passed and surface leakage current is substantially blocked.

25. The device of claim 1, wherein the surface Fermi energy level is pinned either near or below the valence band energy level and the unipolar bather is configured to lower the valence band energy level such that the bulk photocurrent is passed and surface leakage current is substantially blocked.

26. The device of claim 1, wherein the unipolar barrier includes a graded portion having a relatively low bandgap p-type material, a relatively high bandgap p-type material, and another relatively low bandgap p-type material to thereby form an electron barrier.

27. The device of claim 1, wherein the unipolar barrier includes a graded portion having a relatively low bandgap n-type material, a relatively high bandgap n-type material, and another relatively low bandgap n-type material to thereby form a hole barrier.

28. A method for making a semiconductor device, the method comprising:
   forming an n-type material;
   forming a p-type material, the p-type material and the n-type material forming at least one p-n junction having a depletion region, the at least one p-n junction being configured to generate bulk photocurrent is response to incident light, the at least one p-n junction being characterized by a conduction band energy level, a valence band energy level and a surface Fermi energy level, the surface Fermi energy level being pinned either near or above the conduction band energy level or near or below the valence band energy level; and
   forming a unipolar barrier structure in a predetermined region within the at least one p-n junction, the unipolar barrier being configured to raise the conduction band energy level if the surface Fermi energy level is pinned near or above the conduction band energy level or lower the valence band energy level if the surface Fermi energy level is pinned near or below the valence band energy level such that the unipolar barrier is configured to propagate the bulk photocurrent and substantially block surface leakage current, the n-type material, the p-type material and the unipolar barrier being integrally formed by the method for making the semiconductor device.

29. The method of claim 28, wherein the method for making a semiconductor device is selected from a group of processes including physical vapor deposition (PVD), chemical vapor deposition (CVD), metal organic chemical vapor deposition (MOCVD), electrochemical deposition (ECD), molecular beam epitaxy (MBE), liquid phase epitaxy (LPE), vapor phase epitaxy (VPE) and atomic layer deposition (ALD).

30. The method of claim 28, wherein the unipolar barrier is characterized by a valence band that is substantially aligned to the valence band of either the n-type material or the p-type material.

31. The method of claim 28, wherein the unipolar barrier is characterized by a conduction band that is substantially aligned to the conduction band of either the n-type material or the p-type material.

32. The method of claim 28, wherein the step of forming the unipolar barrier further comprises:
    depositing a mixture of low band gap material and high band gap material over a substrate comprising the low band gap material, the mixture initially including more low band gap material than high band gap material;
    increasing an amount of high band gap material as a function of time over a first predetermined time frame until an apex of the unipolar barrier is formed;
    decreasing the amount of high band gap material as a function of time over a second predetermined time frame until the amount of high band gap material is substantially equal to zero.

* * * * *

UNITED STATES PATENT AND TRADEMARK OFFICE
CERTIFICATE OF CORRECTION

PATENT NO. : 8,274,096 B2
APPLICATION NO. : 12/706016
DATED : September 25, 2012
INVENTOR(S) : Gary W. Wicks It is certified that error appears in the above-identified patent and that said Letters Patent is hereby corrected as shown below:

Column 14, claim 24, line 29 the word "bather" should be "barrier." At column 14, claim 25, line 35 the word "bather" should be "barrier." At column 14, claim 28, line 54 the word "is" should be "in."

Signed and Sealed this
Fifth Day of February, 2013

Teresa Stanek Rea
*Acting Director of the United States Patent and Trademark Office*